United States Patent [19]

Liu et al.

[11] Patent Number: 5,385,869
[45] Date of Patent: Jan. 31, 1995

[54] SEMICONDUCTOR CHIP BONDED TO A SUBSTRATE AND METHOD OF MAKING

[75] Inventors: Jay J. Liu, Chandler; Howard M. Berg, Scottsdale; George W. Hawkins, Mesa, all of Ariz.

[73] Assignee: Motorola, Inc., Schaumburg, Ill.

[21] Appl. No.: 94,735

[22] Filed: Jul. 22, 1993

[51] Int. Cl.⁶ .................................... H01L 21/60
[52] U.S. Cl. .................... 437/209; 437/211; 437/214; 437/217; 437/219
[58] Field of Search ............ 437/209, 211, 214, 215, 437/217, 219, 220

[56] References Cited

U.S. PATENT DOCUMENTS

| | | |
|---|---|---|
| 4,280,132 | 7/1981 | Hayakawa et al. ............ 437/211 |
| 4,604,644 | 6/1986 | Beckham et al. ............. 437/211 |
| 4,994,411 | 2/1991 | Naito et al. ................. 437/219 |
| 5,008,213 | 4/1991 | Holesar, Jr. ................. 437/211 |
| 5,057,458 | 10/1991 | Hoeberechts et al. ......... 437/209 |
| 5,081,067 | 1/1992 | Shimizu et al. .............. 437/217 |
| 5,086,018 | 2/1992 | Conru et al. ................. 437/220 |
| 5,120,665 | 6/1992 | Tsukagoshi et al. .......... 437/209 |

FOREIGN PATENT DOCUMENTS

| | | |
|---|---|---|
| 59-143333 | 8/1984 | Japan .................... 437/211 |
| 1161724 | 6/1985 | Japan .................... 437/211 |
| 1191456 | 8/1989 | Japan . |
| 1191457 | 8/1989 | Japan . |

OTHER PUBLICATIONS

D. Suryanarayana et al, "Flip Chip Solder Bump Fatigue Life Enhanced by Polymer Encapsulation," 40th Electronic Component Technology Conference Proceedings, 1990, pp. 338–344.

T. Caulfield et al., "Surface Mount Array Interconnections for High I/O MCM-C to Card Assemblies," 1993 Proceedings of International Conference and Exhibition on Multichip Modules, pp. 320–325.

*Primary Examiner*—Brian E. Hearn
*Assistant Examiner*—Kevin M. Picardat
*Attorney, Agent, or Firm*—Miriam Jackson

[57] ABSTRACT

A semiconductor chip is flip chip bonded to a substrate having a cavity or a through hole formed therein. The cavity or through hole is preferably large enough to substantially remove the narrow gap which is formed between the portion of the substrate which does not have the cavity or through hole formed therein. This allows for use of mold processes to encapsulate and underfill the semiconductor chip and for line of sight cleaning of the semiconductor chip after bonding.

17 Claims, 3 Drawing Sheets

SEMICONDUCTOR CHIP BONDED TO A SUBSTRATE AND METHOD OF MAKING

BACKGROUND OF THE INVENTION

This invention relates, in general, to semiconductor devices, and more particularly, but not limited to, a semiconductor chip electrically interconnected to a substrate.

Flip-chip technology is well known in the art. A semiconductor chip having solder bumps formed on the active or front side of the semiconductor chip is inverted and bonded or attached to a substrate through the solder bumps by reflowing the solder. A solder joint is thus formed between the semiconductor chip and the substrate and a narrow gap formed between the semiconductor chip and the substrate.

One major obstacle to flip-chip technology is the unacceptable reliability of the solder joints due to the mismatch of the coefficient of thermal expansion between the semiconductor chip and the substrate. The substrate is typically comprised of a ceramic material or a polymer composite. In addition, because the solder joints are small, they are subject to failures.

In the past, the solder joint integrity of flip-chip interconnects to a substrate has been enhanced by underfilling the volume between the semiconductor chip and the substrate with an underfill material comprised of a suitable polymer. The underfill material is typically dispensed around two adjacent sides of the semiconductor chip and the underfill material flows by capillary action to fill the gap between the semiconductor chip and the substrate.

As the spacing between each solder bump is reduced, the height of the solder bump is similarly reduced, especially when using semiconductor chips which have solder bumps formed at the periphery of the semiconductor chip. The height of the solder bump creates a very narrow gap between the semiconductor chip and the substrate, approaching less than 50 microns, which can not be adequately underfilled by using existing underfill techniques.

One way to solve the problem is to use an underfill material which readily flows in the narrow gap between the semiconductor chip and the substrate. This underfill material contains less filler material than other underfill materials which do not flow as readily in narrow gaps of 50 microns or less. A problem with this type of material is that it also has an extremely high mismatch of the coefficient of thermal expansion between it and the semiconductor chip, the solder bumps, and the substrate because of the reduced amount of filler material contained therein. It would be desirable to provide an underfill material which has thermal properties which more closely match that of the surrounding materials.

It is also important that the underfill material adhere well to the semiconductor chip, the solder bumps, and the substrate (all of the interfaces) to improve the solder joint integrity. Before bonding the semiconductor chip to the substrate, flux, a chemical such as a rosin, is usually applied to the semiconductor chip and the substrate to free them from oxides and promote the bonding thereof. After bonding, the flux must be removed because any remaining residue from the flux may affect the adhesion properties of the underfill material and may also pose a corrosion problem to the semiconductor chip.

In the past, flux has been removed by an organic solvent or aqueous solution. The flux used in bonding the flip chip to the substrate is hard to remove because of the narrow gap left between the semiconductor chip and the substrate. Thus, remaining residue from the flux has inhibited the bonding of the underfill material to the semiconductor chip and the substrate, causing subsequent delamination of the underfill material. This delamination shortens the fatigue life of the solder joints. Thus, it would be advantageous to provide a method of improving the adhesion between the encapsulation material and all of the interfaces.

Advances in the composition of flux have reduced the amount of residue that is left remaining after use. However, this type of flux may still require cleaning of residue to promote better adhesion at all the interfaces.

In addition, a fluxless removal process of oxides has been used. This fluxless process involves the use of a reducing atmosphere and, if desired, a corrosive gas, to remove oxides. This process leaves no residue, however, it would still be desirable to clean contaminants present on the surface of the semiconductor chip prior to encapsulation.

SUMMARY OF THE INVENTION

A structure and method for bonding a semiconductor chip to a substrate comprises a semiconductor chip having a first major surface and a second major surface and electrical interconnection means formed on the first major surface. The semiconductor chip is bonded to a substrate through the electrical interconnection means and the first major surface of the substrate. At least a portion of the first major surface of the substrate is removed which extends from the first major surface down to into at least a portion of the substrate.

In a second embodiment, a through hole is provided in the substrate such that greater than 50% of the first major surface of the semiconductor chip is exposed.

DETAILED DESCRIPTION OF THE DRAWINGS

Figure 1:
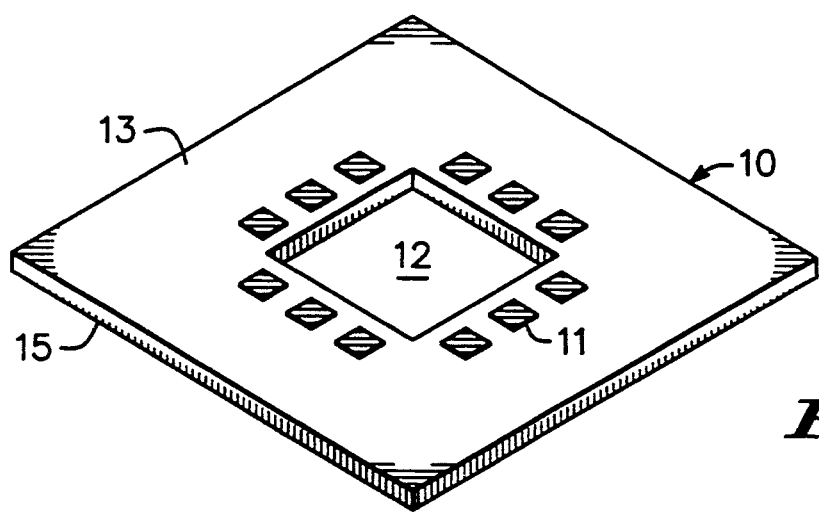
FIG. 1 illustrates a perspective view of an embodiment of a substrate used in the present invention.

FIG. 1 illustrates a first embodiment of a substrate used in the present invention. What is shown is a substrate 10 having a through hole 12 formed therein. Substrate 10 is preferably comprised of a printed circuit board or other carrier which is used in flip chip technology. The required dimensions of through hole 12 will be described later with reference to FIG. 3. Substrate 10 has a first major surface 13 and a second major surface 15. Typically, contact pads 11 are formed on first major surface 13 of substrate 10, which are later bonded to electrical interconnection means 23 formed on a semiconductor chip 20 to provide for electrically coupling substrate 10 to semiconductor chip 20 (shown in FIG. 3). Contact pads 11 are comprised of metal, and the formation thereof is well known in the art.

Figure 2:
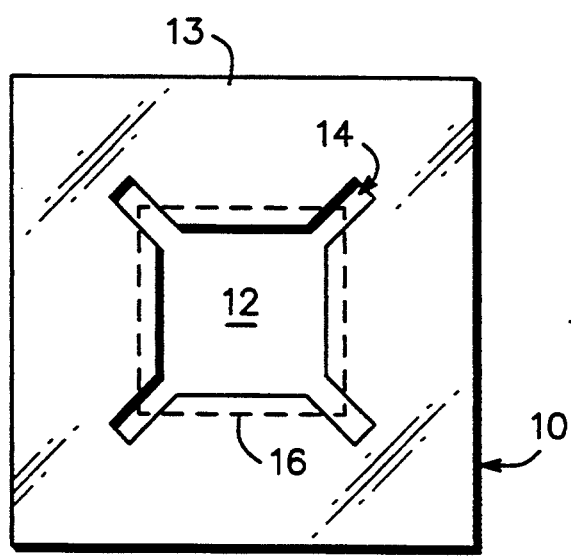
FIG. 2 illustrates a top view of another embodiment of a substrate used in the present invention.

FIG. 2 illustrates a top view of a second embodiment of a substrate used in the present invention. The same reference numerals will be used to refer to the same elements as shown previously throughout the specification. In this embodiment, through hole 12 is formed having gates or notches 14 formed at the corners of the opening. Although four gates 14 are shown in the illustration, the present invention can be carried out with only one gate 14. A dashed line 16 represents the edges of a semiconductor chip which would be bonded to substrate 10.

It is important that a portion of gate 14 extend past edges 16 of the semiconductor chip when the semiconductor chip is bonded to substrate 10. The purpose of gates 14 is to allow an encapsulation material (to be described later) to flow from the side of first major surface 13 of substrate 10 to the side of second major surface 15, or vice versa. This will be more readily apparent later in the description. In a preferred embodiment, the portion of gate 14 which extends past edges 16 of the semiconductor chip has a minimum dimension of three times the average maximum size of filler material comprising the encapsulation material. If a smaller dimension were used, the probability of filler particles blocking the Opening to gates 14, and thus preventing the encapsulation material from flowing through gates 14 would be high. At the present time, this minimum dimension is preferably approximately 75–100 microns.

Figure 3:
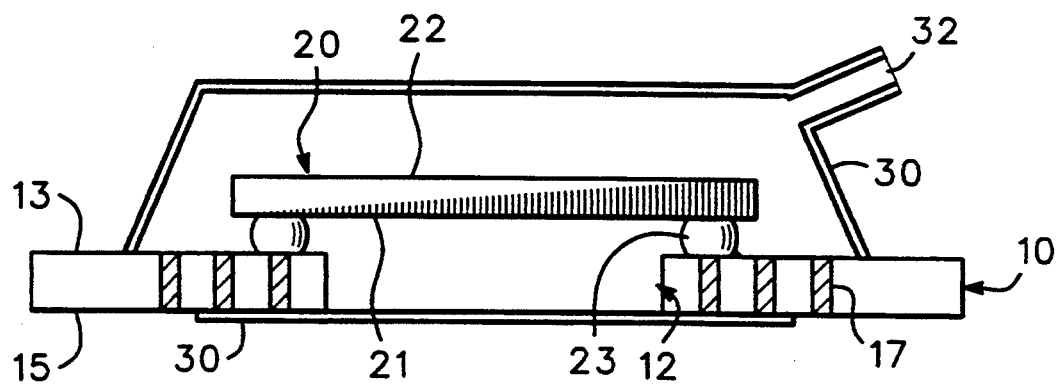
FIG. 3 illustrates a cross-sectional view of a first embodiment of the present invention.

FIG. 3 illustrates an enlarged, cross-sectional view of a first embodiment of the present invention. A semiconductor chip 20 having electrical interconnection means 23 formed at the periphery of a first major surface 21 (the front or active side) thereof is flip-chip bonded to substrate 10. The method of flip-chip bonding is well known in the art, and therefore will not be described in detail herein. Electrical interconnection means 23 are preferably comprised of solder bumps. The formation of such electrical interconnection means 23 is also well known in the art. Electrical interconnection means 23 are electrically coupled to contact pads 11 (shown in FIG. 1, and not shown in FIGS. 3 through 8 to simplify the drawings). Contact pads 11 are electrically coupled to metal layer 17 which were formed in substrate 10 prior to flip chip bonding. The formation of metal layers 17 is well known in the art.

As explained previously, before semiconductor chip 20 is bonded to substrate 10, flux is commonly used on the electrical interconnection means 23 and contact pads 11 to remove any oxidized metal and thus improve adhesion between electrical interconnection means 23 and contact pads 11. Once the bonding takes place, the flux material is preferably removed from all of the surfaces to prevent adhesion and corrosion problems. In the past, the flux material was removed using a standard chemical clean. This chemical clean, however, is inadequate for removing small residue or contamination from the flux left on the surface of electrical interconnection means 23, substrate 10, and semiconductor chip 20.

In the present invention, through hole 12 allows for line of sight cleaning of semiconductor chip 20 and electrical interconnection means 23 before encapsulation. Line of sight cleaning means a clean in which the surface to be cleaned must be exposed to the line of sight of a cleaning media. This is in contrast to an aqueous or gaseous clean which can flow away from the light of sight.

The type of cleaning media can be, for example, ultraviolet (UV)-ozone cleaning or plasma cleaning. Without through hole 12, line of sight cleaning can not be used, because in the UV-ozone cleaning process, UV light must be shown on the surfaces to be cleaned and the plasma cleaning process, ionic particles, such as argon, must be bombarded against the surface to be cleaned. The use of UV-ozone cleaning, as well as plasma cleaning, in general, are well known in the art, and thus will not be described herein.

In the past, it was nearly impossible to expose first major surface 21 of semiconductor chip 20 to the line of sight cleaning media because of the narrow gap left between semiconductor chip 20 and substrate 10. In the present invention, a portion of the narrow gap present between first major surface 21 of semiconductor chip 20 and first major surface 13 of substrate 10 is removed to expose first major surface 21 of semiconductor chip 20.

At a minimum, through hole 12 should expose more than 50%, or a majority, of the area of the first major surface of semiconductor chip 20 to a line of sight substantially perpendicular to first major surface 21. Obviously, it is desirable to expose as much of the area of semiconductor chip 20 as possible. In order to realize more of the benefits of the present invention and it would be desirable to have through hole 12 expose greater than 75% of the area of semiconductor chip 20.

More preferably, the size of through hole 12 is preferably large enough so that the outer edges of through hole 12 extend substantially close to electrical interconnection means 23. Substantially close means the opening is as large as possible, but reliable flip chip bonding of semiconductor chip 20 to substrate 10 can still take place.

The next step involves encapsulating at least a portion of semiconductor chip 20. In this embodiment, a mold 30 is positioned around semiconductor chip 20 and at second major surface 15 of substrate 10. Mold 30 has a gate 32 through which an encapsulation material 34 (shown in FIG. 4) is injected. Although gate 32 is shown to be positioned above second major surface 22 of semiconductor chip 20, gate 32 may be placed on either or both sides of semiconductor chip 20. A plurality of mold gates 32 may be used, although only one is shown in FIG. 3.

Figure 4:
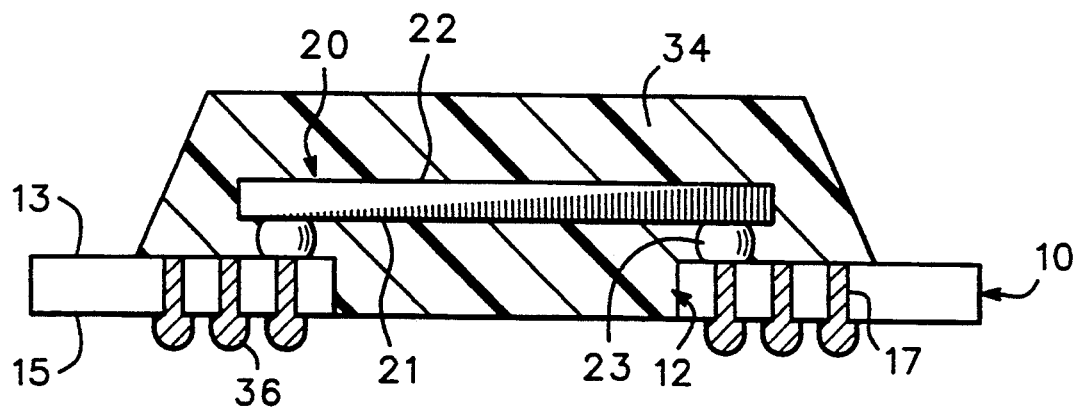
FIG. 4 illustrates a cross-sectional view of the first embodiment of the present invention further along in processing.

FIG. 4 illustrates the structure of FIG. 3 further along in processing. An encapsulation material 34 is injected in mold 30 and then is removed. It is preferable that substantially no encapsulation material 34 be formed on the backside of substrate 10, because it may interfere with additional processing.

In a preferred embodiment, standard mold techniques well known in the art are utilized and encapsulation material 34 is a mold compound. A mold compound, as used herein, is defined as a organic resin matrix which requires an application of pressure for the compound to flow substantially. The organic resin matrix is filled with filler material (comprised of silica) and organic modifiers which control the physical properties of the mold compound. Pressure is required to make a mold compound flow because of the amount of filler material in the mold compound is typically approximately 50–80% by weight. The filler material allows for better thermal expansion matching of the mold compound to semiconductor chip 20 and electrical interconnects 23, a reduction of moisture content, and a reduction of the stress level at the interfaces which improves adhesion at the interfaces and improves the solder joint fatigue life.

When encapsulation material 34 is comprised of a mold compound, substrate 10 has gates 14 (shown in FIG. 2) formed therein so that encapsulation material 34 can readily flow to first major surface 21 of semiconductor chip 20. When encapsulation material 34 is comprised of a mold compound, through hole 12 must be large enough to substantially remove the narrow gap between semiconductor chip 20 and the portion of substrate 10 which does not have through hole 12 formed therein. Stating it in other words, through hole 12 must be large enough to allow for adequate flow of an encapsulation material 34 underneath to first major surface 21 of semiconductor chip 20. Because the length of the narrow gap between first major surface 21 of semiconductor chip 20 and first major surface 13 of substrate 10 (i.e. the portion of substrate 10 where through hole 12 is not formed therein) in the present invention has been substantially reduced, mold compound is able to flow readily to first major surface 21 of semiconductor chip 20.

In addition, substrate 10 must be thick enough such that the combined thickness of substrate 10 and the width of the gap between first major surface 13 of substrate 10 and first major surface 21 of semiconductor chip 20 is thick enough to allow a mold compound to flow and fill the area underneath first major surface 21 of semiconductor chip 20. The thickness should be greater than approximately 5–10 times the average maximum size of a filler material comprising the mold compound to facilitate filling. Based on current technology, this thickness should be at least 150 to 250 microns. At the present time, substrate 10 typically has a thickness of approximately 250 microns.

If no through hole 12 is formed in substrate 10, or a small through hole 12 is formed which does not substantially remove the narrow gap present between first major surface 21 of semiconductor chip 20 and first major surface 13 of substrate 10 as in the prior art, it is not possible for a mold compound to flow through and fill the narrow gap which is left between semiconductor chip 20 and substrate 10. As can be seen, if though hole 12 is too small or a plurality of through holes 12 are formed, the narrow gap between semiconductor chip 20 and substrate 10 will not be substantially removed, and the benefits of the present invention will not be realized. In addition, if a plurality of through holes 12 are formed, this may present more problems in filling the area of the plurality of through holes 12 if they are small enough.

Thus, through hole 12 also provides the advantage of allowing encapsulation material 34 comprised of a mold compound to flow beneath semiconductor chip 20 during the molding process as well as allowing for line of sight cleaning.

Thereafter, electrical interconnection means 36 are formed on second major surface 15 of substrate 10. Electrical interconnection means 36 are electrically coupled to metal layers 17. The formation of electrical interconnection means 36 is well known in the art.

Figure 5:
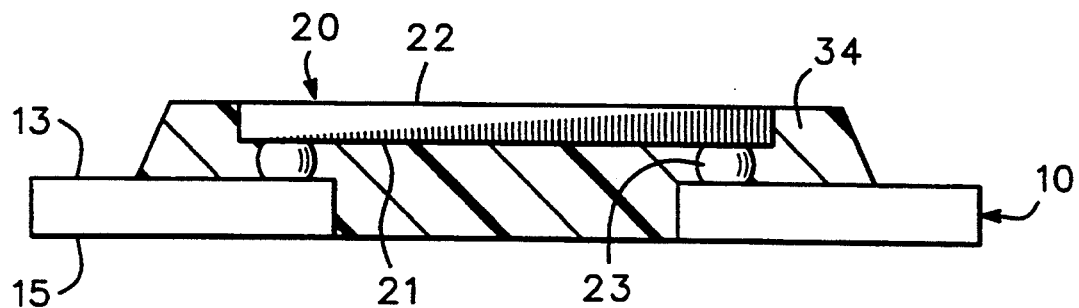
FIG. 5 illustrates a cross-sectional view of a second embodiment of the present invention.

FIG. 5 illustrates a second embodiment of the present invention. The difference between this embodiment and the first embodiment shown in FIG. 4 is that encapsulation material 34 is not disposed on second major surface 22 of semiconductor chip 20. Here, the size and configuration of a mold (not shown) used prevents the formation of the mold compound thereon. Metal layers 17 and electrical interconnection means 36 are not shown hereinafter to simplify the drawings.

Figure 6:
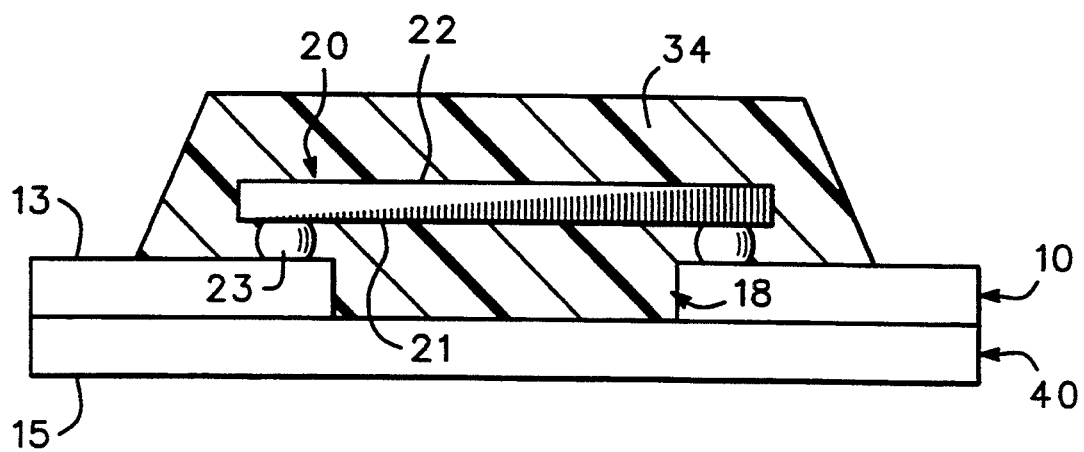
FIG. 6 illustrates a cross-sectional view of a third embodiment of the present invention.

FIG. 6 illustrates a third embodiment of the present invention. The difference between this embodiment and the first embodiment shown in FIG. 4 is that the substrate is now comprised of multiple substrate layers 10 and 40. Also, a cavity 18 is formed in the plurality of substrate layers 10 or 40, rather than through hole 12.

Cavity 18 preferably extends across the first major surface of substrate layer 10 substantially close to electrical interconnection means 23 as through hole 12 does. However, cavity 18 only extends from first major surface 13 of substrate layer 10 down into a portion of substrate layers 10 or 40. As only one example, FIG. 6 shows cavity 18 extending down through substrate layer 10; many other variations are certainly possible. Also cavity 18 may be formed in substrate 10 comprised of a single layer as shown in FIG. 4.

When a mold compound is used as encapsulation material 34, the depth of cavity 18 must be large enough so that the spacing between first major surface 21 of semiconductor chip 20 and the bottom of cavity 18 is at least thick enough to allow a mold compound to flow therethrough as described above with reference to through hole 12. Based on current technology, this dimension should be equal to or greater than 150 to 250 microns. If another type of encapsulation material 34 is used other than a mold compound, then cavity 18 does not have to be as deep. Note that in forming encapsulation material 34 around semiconductor chip 20 in this embodiment, a mold 30 is only required on the top surface of substrate 10. This embodiment is not as preferable as the first embodiment shown in FIG. 4 because it does not allow for line of sight cleaning of first major surface 21 of semiconductor chip 20 through a through hole 12.

Figure 7:
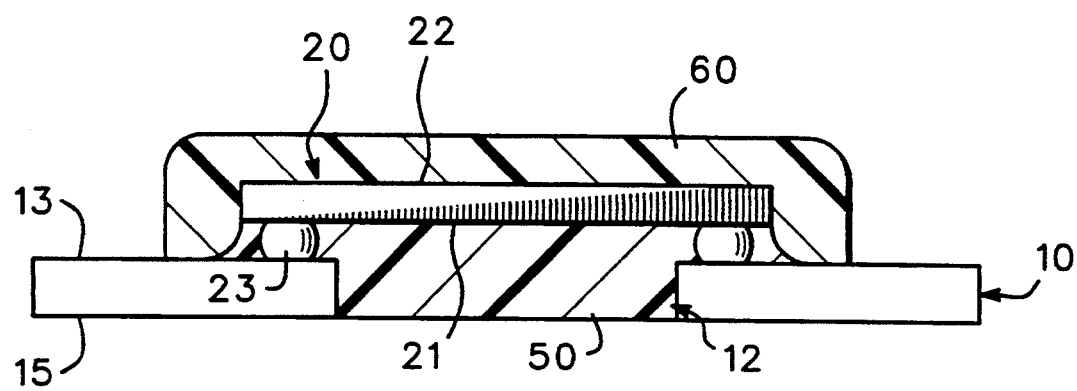
FIG. 7 illustrates a cross-sectional view of a fourth embodiment of the present invention.

FIG. 7 illustrates a fourth embodiment of the present invention. Here, the process of encapsulating semiconductor chip 20 is different than the previous two embodiments. An underfill material or liquid encapsulant 50 is first formed at first major surface 21 of semiconductor chip 20 using conventional techniques. Liquid encapsulant 50 is defined herein as a resin which does not require the application of pressure for it to flow substantially. This liquid encapsulant 50 can be a material which has some amount of filler to improve the thermal expansion, yet still flow readily underneath semiconductor chip 20. It is not required that this liquid encapsulant 50 be a resin or epoxy used in the prior art which has properties that allow it to flow in narrow gaps around 50 microns. This type of liquid encapsulant used in the prior art has less filler material and filler material of a smaller size than a mold compound or a liquid encapsulant which is designed to flow in gaps greater than 50 microns. As stated previously, this liquid encapsulant used in the prior art is not desirable because of the thermal expansion mismatch problems it presents.

Thereafter, another encapsulation material 60 is formed to cover semiconductor chip 20, if desired. Encapsulation material 60 may be comprised of a mold compound or a liquid encapsulant. A molding process may be used with a mold compound or a glop-top method may be utilized with a liquid encapsulant to form encapsulation material 60. The glop-top method is well known in the art. The advantage of this embodiment is that the amount of liquid encapsulant 50 can be minimized and thus reduce cost in the overall package because the cost of liquid encapsulant 50 is higher than a mold compound.

Figure 8:
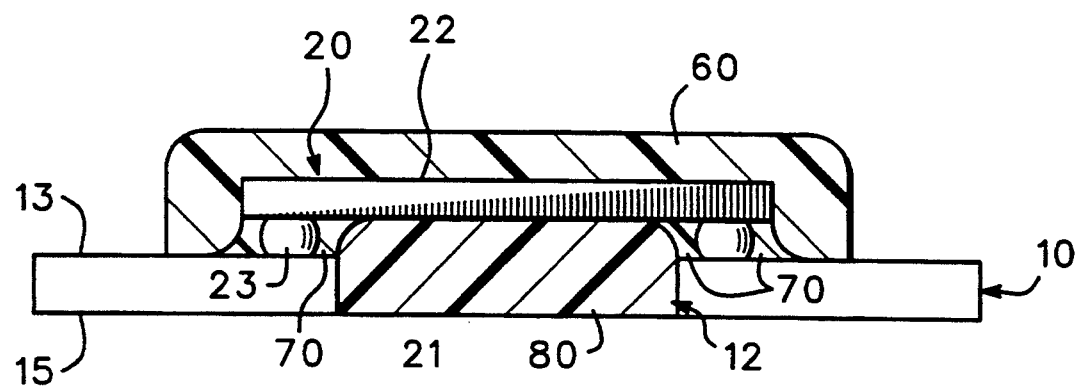
FIG. 8 illustrates a cross-sectional view of a fifth embodiment of the present invention.

FIG. 8 illustrates a fifth embodiment of the present invention. This embodiment is similar to that shown in FIG. 7. Here, liquid encapsulant 70 is formed only around electrical interconnection means 23. Encapsulation material 60 is the same as that described with reference to FIG. 7. If desired, an encapsulation material 80 is formed to fill through hole 12, which is preferably comprised of a liquid encapsulant.

As can be readily seen, the present invention allows for the use of a mold compound in flip-chip processing which improves the thermal expansion and adhesion properties of the package. In addition, one embodiment of the flip-chip package of the present invention allows for cleaning of the first major surface of semiconductor chip to further improve the adhesion properties of the encapsulation material to the semiconductor chip.

We claim:

1. A method of bonding a semiconductor chip to a substrate, comprising the steps of:
    providing a semiconductor chip having a first major surface and a second major surface, and having electrical interconnection means formed on the first major surface of the semiconductor chip;
    providing a substrate having a first major surface and a second major surface and a through hole formed therein having outer edges;
    electrically coupling the semiconductor chip to the substrate through the electrical interconnection means and the first major surface of the substrate such that greater than 50% of the first major surface of the semiconductor chip is exposed by the through hole;
    line of sight cleaning a portion of the first major surface of the semiconductor chip through the through hole; and
    encapsulating the semiconductor chip with an encapsulation material after the step of line of sight cleaning, wherein the encapsulation material is disposed on the first major surface of the semiconductor chip and disposed in the through hole.

2. The method of claim 1 wherein the step of encapsulating further comprises using a molding process to encapsulate the semiconductor chip, and wherein the encapsulation material is comprised of a mold compound.

3. The method of claim 1 wherein the step of providing a substrate further comprises providing the substrate wherein the through hole is large enough to substantially allow a mold compound to flow to the first major surface of the semiconductor chip.

4. The method of claim 1 wherein the step of providing a substrate further comprises providing the substrate wherein the outer edges of the through hole are substantially close to the electrical interconnection means.

5. The method of claim 1 wherein the step of electrically coupling further comprises a gap between the semiconductor chip and a portion of the substrate which does not have the through hole formed therein being substantially removed.

6. The method of claim 1 wherein the step of encapsulating comprises using an encapsulation material comprised of a combination of a liquid encapsulant and a mold compound.

7. The method of claim 1 wherein the step of providing a substrate further comprises providing the substrate having at least one gate formed at the outer edges of the through hole, wherein the at least one gate extends past the semiconductor chip.

8. The method of claim 7 wherein the step of providing a substrate further comprises providing the substrate having the at least one gate having a minimum dimension of three times the average maximum size of a filler material comprising the encapsulation material.

9. The method of claim 1 wherein the step of encapsulating further comprises substantially no encapsulation material disposed on the second major surface of the substrate.

10. A method of bonding a semiconductor chip to a substrate, comprising the steps of:
    providing a semiconductor chip having a first major surface and a second major surface, and having electrical interconnection means formed on the first major surface of the semiconductor chip;
    providing a substrate having a first major surface and a second major surface and a cavity formed therein extending from the first major surface down into at least a portion of the substrate and having outer edges;
    bonding the semiconductor chip to the substrate through the electrical interconnection means and the first major surface of the substrate; and
    encapsulating the semiconductor chip with an encapsulation material comprised of a mold compound using a molding process, wherein the encapsulation material is disposed on at least the first major surface of the semiconductor chip and disposed in the cavity.

11. The method of claim 10 wherein the step of providing a substrate further comprises providing the substrate wherein the cavity is large enough to substantially allow a mold compound to flow to the first major surface of the semiconductor chip.

12. The method of claim 10 wherein the step of providing a substrate further comprises providing the substrate wherein the outer edges of the cavity are substantially close to the electrical interconnection means.

13. The method of claim 10 wherein the step of bonding further comprises a gap between the first major surface of the semiconductor chip and a portion of the substrate which does not have the cavity formed therein being substantially removed.

14. The method of claim 10 wherein the step of providing a substrate further comprises providing the substrate wherein the cavity extends across greater than 50% of the first major surface of the semiconductor chip after the step of bonding the semiconductor chip and the substrate.

15. The method of claim 10 wherein the step of encapsulating comprises using an encapsulation material further comprised of a liquid encapsulant.

16. The method of claim 10 wherein the step of providing a substrate further comprises providing a substrate having at least one gate formed at the outer edges of the cavity, wherein the at least one gate extends past the semiconductor chip.

17. The method of claim 10 wherein the step of providing the substrate further comprises the cavity extending from the first major surface of the substrate to the second major surface of the substrate and wherein greater than 50% of the first major surface of the semiconductor chip is exposed by the cavity.

* * * * *